United States Patent [19]
Daniel

[11] Patent Number: 6,069,048
[45] Date of Patent: May 30, 2000

[54] REDUCTION OF SILICON DEFECT INDUCED FAILURES AS A RESULT OF IMPLANTS IN CMOS AND OTHER INTEGRATED CIRCUITS

[75] Inventor: David W. Daniel, Divide, Colo.

[73] Assignee: LSI Logic Corporation, Milpitas, Calif.

[21] Appl. No.: 09/163,623

[22] Filed: Sep. 30, 1998

[51] Int. Cl.[7] ................................................. H01L 12/331
[52] U.S. Cl. ........................... 438/370; 438/419; 438/526
[58] Field of Search .................................. 438/199, 200, 438/202, 209, 234, 369, 320, 526, 419

[56] References Cited

U.S. PATENT DOCUMENTS

| | | | |
|---|---|---|---|
| H707 | 11/1989 | Hu et al. | 437/26 |
| 3,895,965 | 7/1975 | MacRae et al. | 148/1.5 |
| 4,161,417 | 7/1979 | Yim et al. | 148/175 |
| 4,418,469 | 12/1983 | Fujita | 438/332 |
| 5,094,963 | 3/1992 | Hiraguchi et al. | 437/12 |
| 5,108,944 | 4/1992 | Shirai et al. | 438/209 |
| 5,248,624 | 9/1993 | Icel et al. | 437/31 |
| 5,270,227 | 12/1993 | Kameyama et al. | 438/234 |
| 5,292,671 | 3/1994 | Odanaka | 437/29 |
| 5,436,176 | 7/1995 | Shimizu et al. | 437/27 |
| 5,470,766 | 11/1995 | Lien | 438/419 |
| 5,501,993 | 3/1996 | Borland | 437/34 |
| 5,559,050 | 9/1996 | Alsmeier et al. | 437/45 |
| 5,608,253 | 3/1997 | Liu et al. | 257/365 |
| 6,001,701 | 12/1999 | Carroll et al. | 438/364 |

*Primary Examiner*—John F. Niebling
*Assistant Examiner*—Christopher Lattin

[57] ABSTRACT

A technique for reducing silicon defect induced transistor failures, such as latch-up, in a CMOS or other integrated circuit structure includes fabricating the integrated circuit structure on a substrate and implanting a buried layer beneath a surface of the integrated circuit. The buried layer implant is the final implanting step during fabrication of the integrated circuit structure. In another technique, fabricating the integrated circuit structure includes performing multiple sequential processes some of which are performed at elevated temperatures above about 500° C. A buried layer is implanted beneath a surface of the integrated circuit. After implanting the buried layer, the substrate is subjected to a fabrication process at an elevated temperature above about 800° C. only once. Propagation of defects, such as in-the-range defects or ion enhanced stacking faults, from the buried layer to other device layers during the fabrication process is reduced.

19 Claims, 3 Drawing Sheets

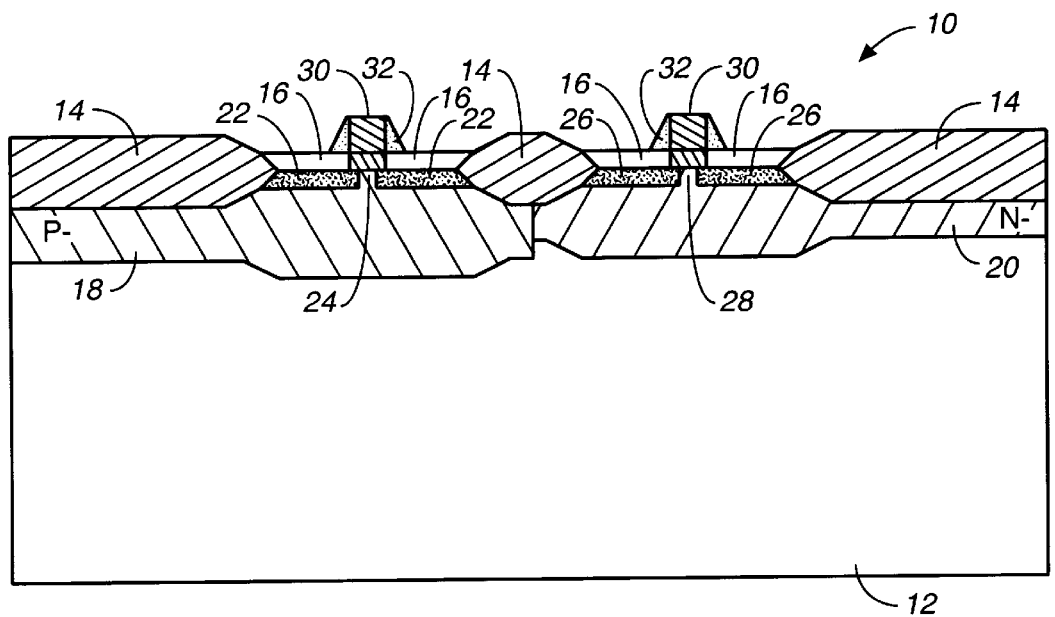
FIG._1
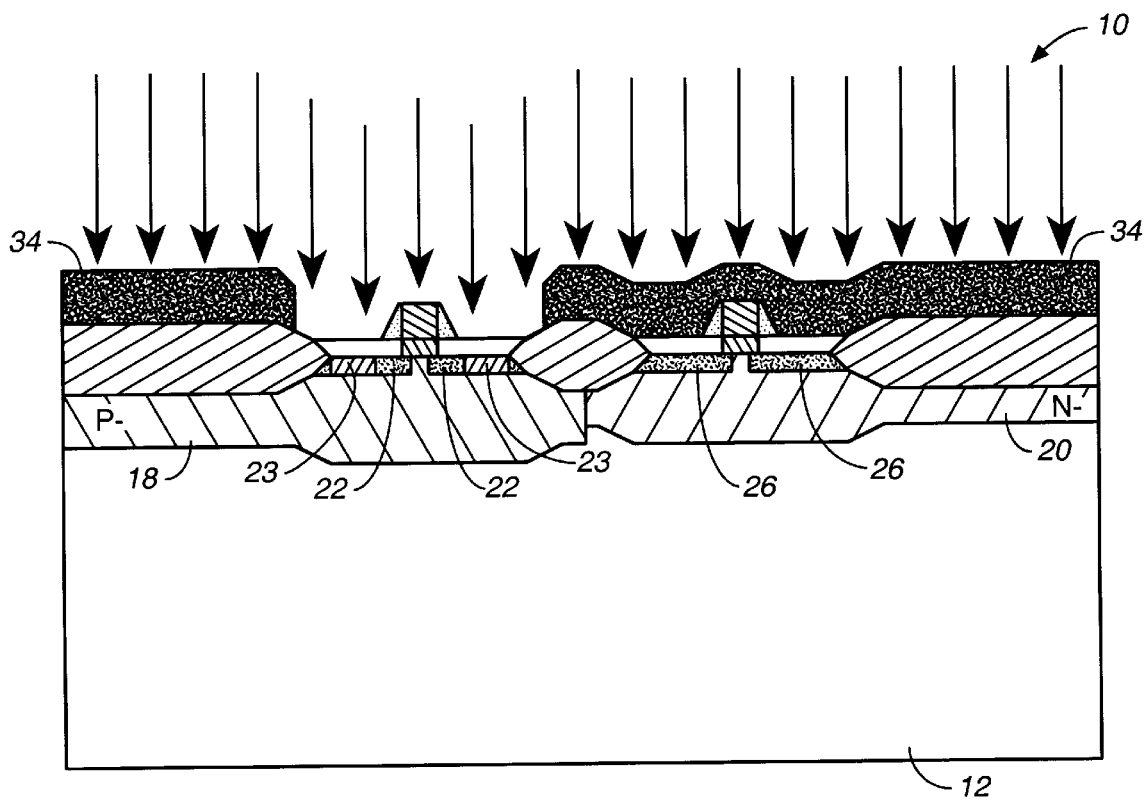
FIG._2A

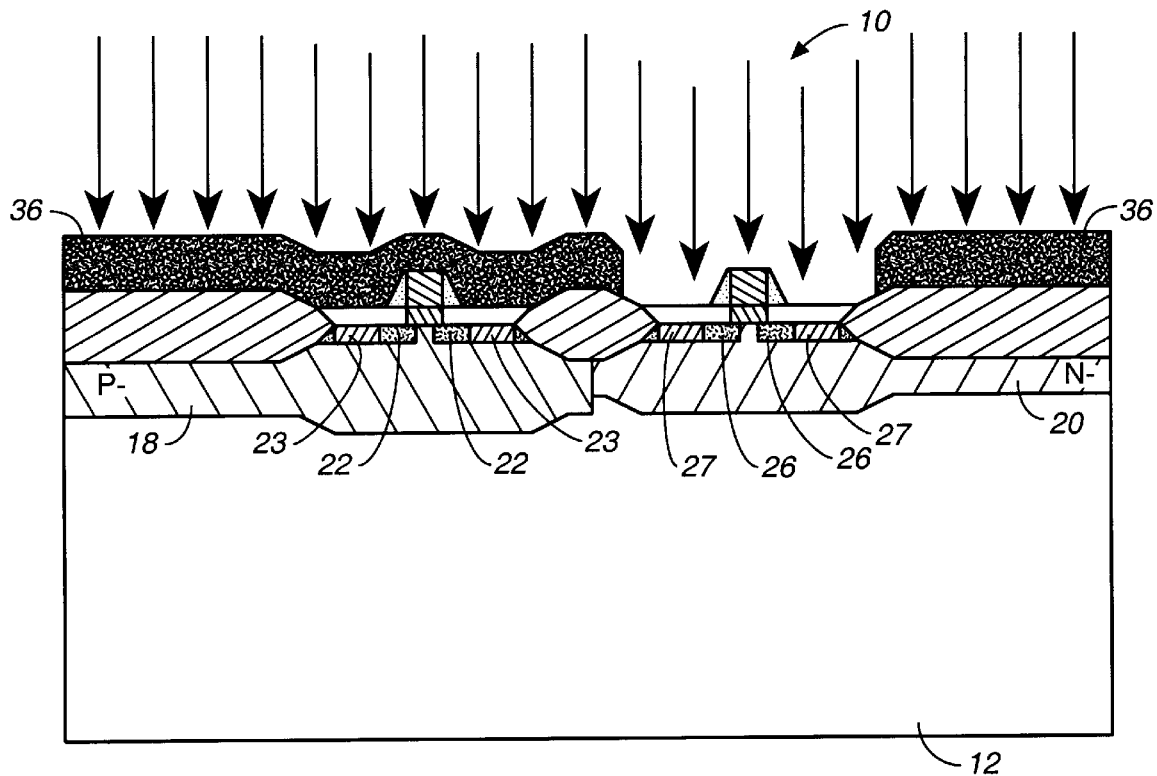
FIG._2B
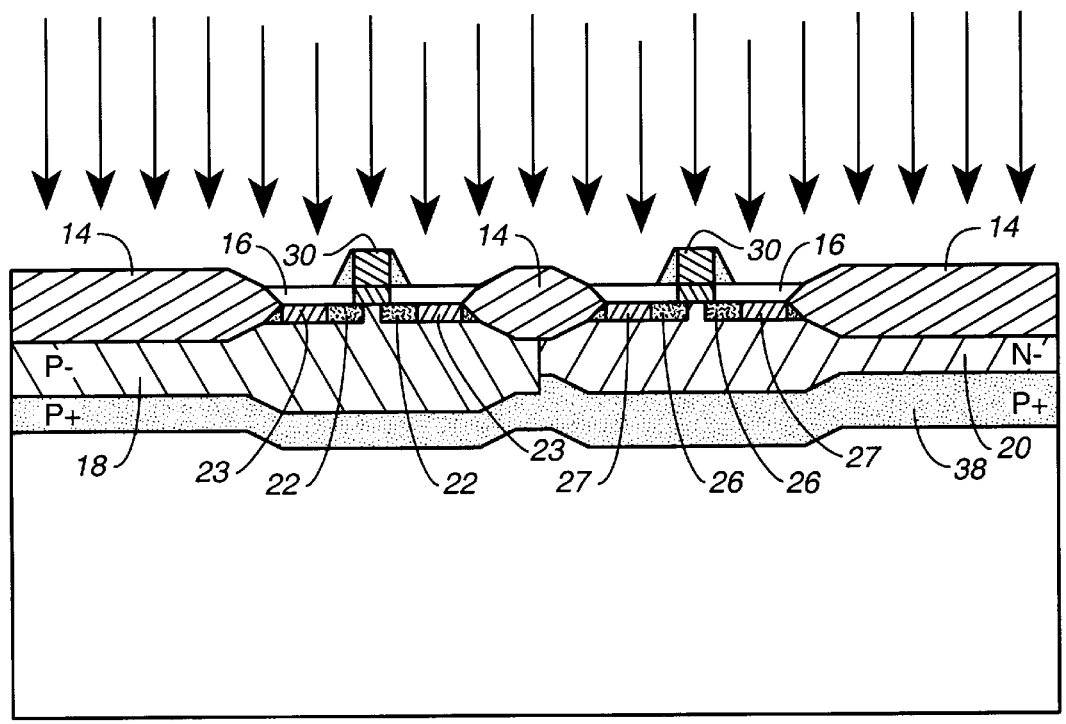
FIG._3

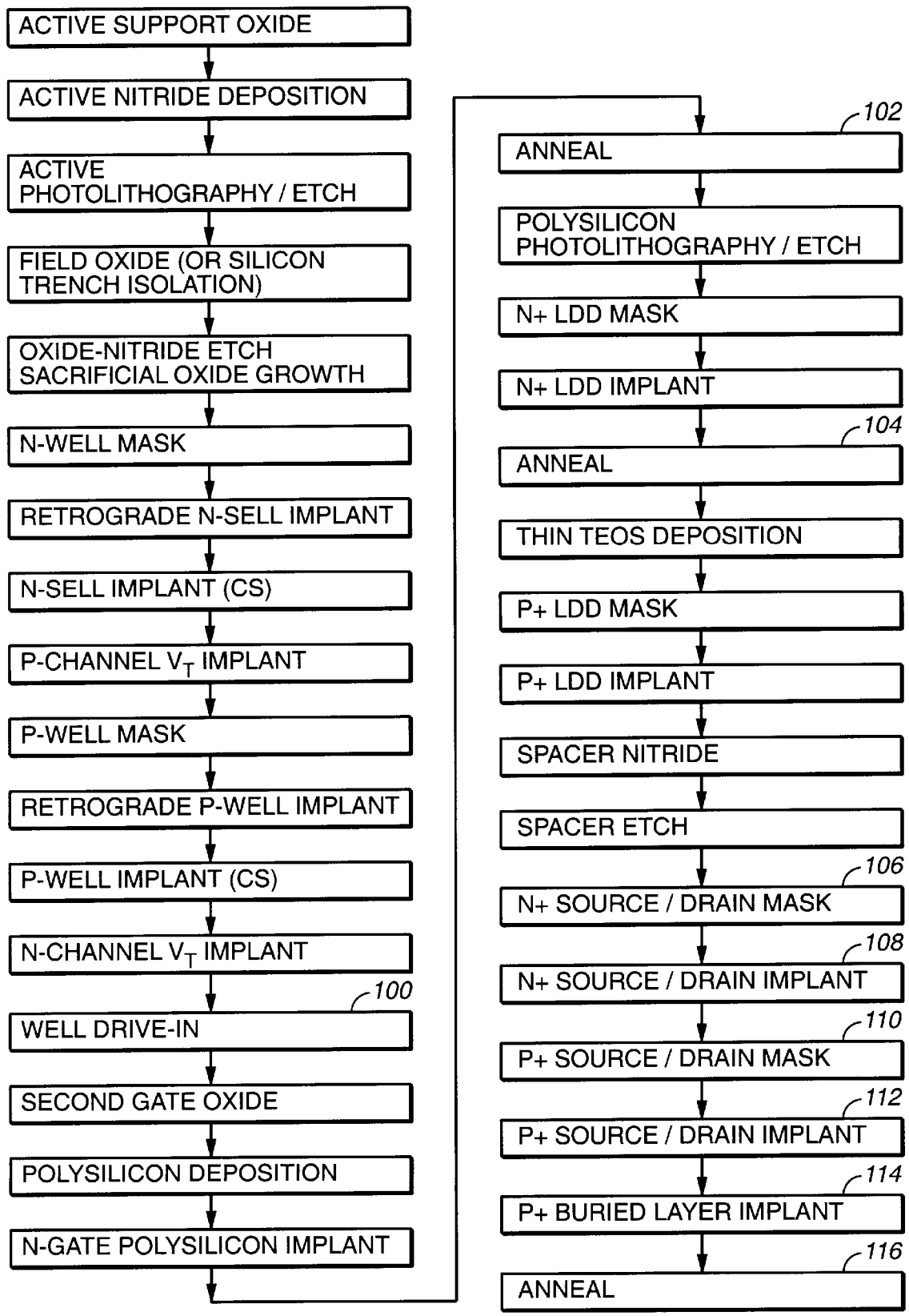
FIG._4 even number 6,069,048

REDUCTION OF SILICON DEFECT INDUCED FAILURES AS A RESULT OF IMPLANTS IN CMOS AND OTHER INTEGRATED CIRCUITS

BACKGROUND

The present invention relates generally to device fabrication and, in particular, to techniques for reducing or eliminating silicon defect induced failures, such as latch-up, in complementary metal-oxide-semiconductor (CMOS) and other integrated circuits.

CMOS integrated circuit chips fabricated with silicon can exhibit a phenomenon known as latch-up during which the integrated circuit is short-circuited and draws excessive current and power from the power supply. Latch-up can result in thermal destruction of the chip.

A typical CMOS structure includes several bi-polar transistors that constitute a potential n-p-n-p device that can latch-up under certain conditions. One such bi-polar structure results from a vertical p-n-p structure formed by the p+ drain/source regions of the p-channel metal-oxide-semiconductor field-effect-transistor (MOSFET), the n-tub and the p-substrate. A lateral n-p-n structure can result from the n-tub, the p-substrate and the n+ drain/source regions of the n-channel MOSFET. Additionally, the inclusion of input protection diodes (n+p to the substrate and p+n to the n-well) with p+ contacts to the substrate and n+ contacts to the tub can further complicate the situation.

A necessary condition for latch-up is that the product of the n-p-n and p-n-p transistor gains exceeds unity. Furthermore, the end junctions of the structure must become forward biased. Under normal operating conditions, the latter condition does not occur. However, it may occur due to transient signals or in a high radiation environment. Additionally, the $V_{DD}$ power supply and the input circuit must be capable of providing the holding current for the p-n-p-n device. Under those conditions, The p-n-p-n device can exhibit positive feedback and behave like a short circuit. The signal feeds upon itself and grows exponentially until it turns into a large current short-circuit path.

One technique for reducing the occurrence of latch-up failure involves providing a heavily doped buried layer beneath a more-lightly doped layer upon which the remainder of the integrated circuit is fabricated. The heavily doped buried layer increases the holding current and voltage as well as the critical current to prevent the occurrence of latch-up during normal operation of the semiconductor device. The buried layer shorts the adjacent p-n junctions so that they cannot become forward biased. Positive feedback, therefore, is inhibited, and high current and power consumption are avoided.

Although a heavily doped buried layer can reduce the occurrence of latch-up, various defects in the buried layer, such as in-the-range defects or boron-enhance stacking faults, can propagate and become redistributed in other device layers during subsequent fabrication steps performed at elevated temperatures. Such elevated temperature steps include, for example, oxidation, activation and annealing processes. The propagation of defects from the buried layer to other device layers during the fabrication process reduces the overall yield and can reduce device performance and reliability.

SUMMARY

In general, techniques are described for reducing or eliminating silicon defect induced transistor failures in an integrated circuit structure, such as a CMOS device. The techniques incorporate the formation of a buried layer, but also can help reduce or minimize the propagation of various defects from the buried layer to active regions of the integrated circuit structure.

According to one aspect, a method includes fabricating the integrated circuit structure on a substrate and implanting a buried layer beneath a surface of the integrated circuit. The buried layer implant is the final implanting step during fabrication of the integrated circuit structure.

In another aspect, fabricating the integrated circuit structure includes performing multiple sequential processes some of which are performed at elevated temperatures above about 500° C. A buried layer is implanted beneath a surface of the integrated circuit. After implanting the buried layer, the substrate is subjected to a fabrication process at an elevated temperature above about 800° C. only once.

In various implementations, one or more of the following features are present. Fabricating the integrated circuit structure can include forming active device regions such as gate oxides and/or doped source and drain transistor regions prior to implanting the buried layer.

Implanting the buried layer can include driving ions into the substrate. The buried layer can be either p-type or n-type depending on the type of substrate used. A high energy ion beam can be used to implant the ions at a predetermined depth below the surface of the integrated circuit structure. In one implementation, for example, the energy level of the ion beam is in a range of about 1.4 MeV to about 2.5 MeV.

The substrate can be annealed to activate ions implanted in the buried layer. Annealing the substrate to activate the ions implanted in the buried layer can be the final fabrication step during which the substrate is at an elevated temperature.

By performing the buried layer ion implant as the last implant in the device fabrication process, the buried layer is subjected to a single subsequent annealing process, rather than being subjected to multiple subsequent processes at elevated temperatures. In this manner, the propagation of defects, such as in-the-range defects or ion enhanced stacking faults, from the buried layer to other device layers during the fabrication process is reduced. That, in turn, can help improve the overall yield of the fabrication process as well as reduce or eliminate latch-up failures. Device performance and reliability also can be improved.

Other features and advantages will be readily apparent from the following detailed description, accompanying drawings and the claims.

BRIEF DESCRIPTION OF THE DRAWINGS

FIG. 1 illustrates an exemplary partially-fabricated CMOS device according to the invention.

FIGS. 2A and 2B illustrate source/drain implants for PMOS and NMOS transistors in the device of FIG. 1, respectively.

FIG. 3 illustrates a buried layer implant for the CMOS device.

FIG. 4 illustrates an exemplary process flow for fabricating the CMOS device.

DETAILED DESCRIPTION

As shown in FIG. 1, an exemplary CMOS device 10 is fabricated on a lightly doped p-type silicon or other semiconductor substrate 12. The partially-fabricated device 10 includes thick field oxide regions 14 separating areas in which the active device regions are formed. Retrograde p-type and n-type wells 18, 20 are formed which encompass the respective active regions. Thin layers of gate oxide 16 are disposed over the active regions.

Lightly doped n+ source and drain regions 22 are formed in the retrograde p-type well 18 for a first p-type MOS (PMOS) transistor. The non-doped region between the n+ source and drain regions 22 forms a p-type channel 24 for the first transistor. Similarly, lightly doped p+ source and drain regions 26 are formed in the retrograde n-type well 20 for a second n-type MOS (NMOS) transistor. The non-doped regions between the p+ source and drain regions 26 form an n-type channel 28 for the second transistor. Polysilicon gates 30 are formed over the respective channels 24, 28, and spacers 32 are provided adjacent the polysilicon gates 30.

The various layers and regions shown in FIG. 1 can be fabricated using known techniques, and typically include one or more oxidation, annealing or other steps performed at elevated temperatures. FIG. 4 illustrates an exemplary process flow for fabrication of the CMOS device 12. The process flow includes several steps, such as well drive-in step 100 and annealing steps 102, 104, that are performed at elevated temperatures greater than about 500° C., and typically as high as about 800° C. to 1,200° C.

As illustrated by FIGS. 2A and 2B, photolithography can be used to provide masks 34, 36 for further doping of the source and drain regions 22, 26, respectively. With the photoresist mask 34 deposited over the upper surface of the substrate 12 (step 106), an n+ ion implant is performed to provide heavily doped n-type source and drain regions 23 for the PMOS transistor (step 108). The photoresist mask 34 is removed by known techniques. The photoresist mask 36 is deposited over the surface of substrate 12 (step 110), and a p+ ion implant is performed to provide heavily doped p-type source and drain regions 27 for the NMOS transistor (step 112). The photoresist mask 36 also is removed by known techniques.

Next, an ion implant is performed to provide a heavily doped buried layer 38 (FIG. 3) beneath the less heavily doped wells 18, 20 (step 114). Preferably, the ion implant for the buried layer is the final implant in the device fabrication. In the case of a p-type substrate 12, a p+ buried layer 38 can be formed, for example, by implanting high energy boron or gallium ions. For example, boron ions having energies in the range of about 1.4 mega electron volts (MeV) to about 2.5 MeV can be implanted in the substrate 12 to form the p+ buried layer. A high energy beam of ions can be used for that purpose. In one implementation, for example, boron ions ($B^{11}$) are directed to the surface of the substrate 12 at approximately $1\times10^{13}$ to approximately $5.5\times10^{15}$ atoms per centimeter squared.

In general, the depth of penetration of the ions depends on the energy of the ion beam. A higher energy beam will implant the ions deeper into the substrate 12. The final ion implant for the buried layer can be performed over the entire upper surface of the substrate 12 and does not require an additional masking step.

Once the ion implant is performed for the buried layer 38, an annealing process is performed to drive in and activate the implanted ions in the source and drain regions as well as in the buried layer (step 116). The annealing process following the ion implant for the buried layer preferably is the final device fabrication process which is performed at an elevated temperature. In one implementation, for example, a rapid thermal anneal process is performed at a temperature in the range of about 800 degrees Celsius (° C.) to about 1,200° C. for a duration of approximately 10 to 60 seconds.

In general, additional fabrication processes and steps, such as metallization, will be performed after the annealing step 116. However, by performing the buried layer ion implant as the last implant in the device fabrication process, the buried layer 38 is subjected to a single subsequent high temperature process, rather than being subjected to multiple subsequent processes at elevated temperatures. In particular, the buried layer 38 is subjected to elevated temperatures above about 800° C. only during the single annealing step 116 because subsequent fabrication processes, such as metallization steps, are typically performed at considerably lower temperatures of about 450° C. or less. Therefore, more generally, the buried layer 38 is subjected to elevated temperatures above about 500° C. only a single time, in other words, during the annealing step 116. In this manner, the propagation of defects, such as in-the-range defects or ion enhanced stacking faults, from the buried layer to other device layers during the fabrication process is reduced. That, in turn, can help improve the overall yield of the fabrication process as well as reduce or eliminate latch-up failures. Device performance and reliability also can be improved.

Although the ion implant for the buried layer is preferably performed as the final implant step in the fabrication process, the buried layer ion implant alternatively can be performed just prior to the n+ and p+ implants for the source and drain regions of the transistors. The buried layer would still be subjected to only a single subsequent annealing process following the n+ and p+ source and drain implants, thereby minimizing the propagation of defects from the buried layer into active device layers.

Furthermore, although the techniques described above has been described with respect to CMOS device fabricated on a p-type substrate, the technique also can be used for forming a heavily doped buried layer for a CMOS device fabricated on an n-type substrate. In that case, the high energy ion implant can be performed using a beam of phosphorous or arsenic ions to provide an n+ buried layer.

In addition, although the forgoing techniques have been described with respect to a particular CMOS device, the techniques also can be applied to other devices in which a buried layer is provided, including, for example, bi-CMOS devices and devices incorporating silicon trench isolation (STI).

Other implementations are within the scope of the following claims.

What is claimed is:

1. A method of reducing silicon defect induced transistor failures in an integrated circuit structure, the method comprising:

fabricating the integrated circuit structure on a substrate; and implanting a buried layer beneath a surface of the integrated circuit, wherein the buried layer implant is a final implanting step during fabrication of the integrated circuit structure.

2. The method of claim 1 wherein fabricating the integrated circuit structure includes performing one or more elevated temperature processes prior to implanting the buried layer.

3. The method of claim 1 wherein fabricating the integrated circuit structure includes forming active device regions prior to implanting the buried layer.

4. The method of claim 3 wherein fabricating the integrated circuit structure includes forming a gate oxide layer prior to implanting the buried layer.

5. The method of claim 1 wherein implanting a buried layer includes driving ions into the substrate.

6. The method of claim 5 further including:
annealing the substrate to activate ions implanted in the buried layer.

7. The method of claim 6 wherein annealing the substrate to activate the ions implanted in the buried layer is a final fabrication step during which the substrate is at an elevated temperature.

8. The method of claim 5 wherein a beam of ions having an energy level is controlled to implant the ions at a predetermined depth below the surface of the integrated circuit structure.

9. The method of claim 8 wherein the energy level is at in a range of about 1.4 MeV to about 2.5 MeV.

10. The method of claim 1 wherein implanting a buried layer includes implanting a p-type doped buried layer.

11. The method of claim 1 wherein implanting a buried layer includes implanting an n-type doped buried layer.

12. The method of claim 1 wherein fabricating the integrated circuit structure includes fabricating a CMOS structure.

13. A method of reducing silicon defect induced transistor failures in an integrated circuit structure, the method comprising:
fabricating the integrated circuit structure on a substrate, wherein fabricating includes performing multiple sequential processes some of which processes are performed at elevated temperatures above about 500° C.;
implanting a buried layer beneath a surface of the integrated circuit;
after implanting the buried layer, subjecting the substrate to a fabrication process at an elevated temperature above about 800° C. only once.

14. The method of claim 13 wherein implanting a buried layer includes driving ions into the substrate.

15. The method of claim 14 wherein subjecting the substrate to a fabrication process at an elevated temperature includes performing an annealing process to activate the ions implanted into the substrate.

16. The method of claim 13 wherein fabricating the integrated circuit structure includes forming active device regions prior to implanting the buried layer.

17. The method of claim 13 wherein fabricating the integrated circuit structure includes forming a gate oxide layer prior to implanting the buried layer.

18. The method of claim 13 wherein fabricating the integrated circuit structure includes forming doped source and drain transistor regions prior to implanting the buried layer.

19. The method of claim 13 wherein fabricating the integrated circuit structure includes fabricating a CMOS structure.

* * * * *